United States Patent [19]

Lee

[11] Patent Number: 4,935,645
[45] Date of Patent: Jun. 19, 1990

[54] FUSING AND DETECTION CIRCUIT
[75] Inventor: Robert D. Lee, Denton, Tex.
[73] Assignee: Dallas Semiconductor Corporation, Dallas, Tex.
[21] Appl. No.: 163,082
[22] Filed: Mar. 2, 1988
[51] Int. Cl.[5] .............................................. H03K 5/153
[52] U.S. Cl. .................................... 307/362; 324/110; 328/146; 365/96; 357/51
[58] Field of Search .................. 307/350, 362; 357/51; 328/146, 147, 8; 324/110, 73 PC; 365/96

[56] References Cited
U.S. PATENT DOCUMENTS

| | | | |
|---|---|---|---|
| 4,104,546 | 8/1978 | Seiler | 307/362 |
| 4,121,122 | 10/1978 | Pokrandt | 307/362 |
| 4,287,569 | 9/1981 | Fukushima | 365/96 |

Primary Examiner—John Zazworsky
Attorney, Agent, or Firm—Worsham, Forsythe, Sampels & Wooldridge

[57] ABSTRACT

A fusing and detection circuit includes a diode fusing element which is coupled to a fuse input terminal of an integrated circuit. Upon the application of the proper voltage at the fuse input terminal, the fuse element is blown, causing the diode to become a low impedance resistor. The detection circuitry senses whether the fuse has been blown or not and provides a lock or unlock indication at an output terminal. The fusing and detection circuit is designed to thwart attempts to change the lock status to an unlock status after the fuse has been blown.

20 Claims, 2 Drawing Sheets

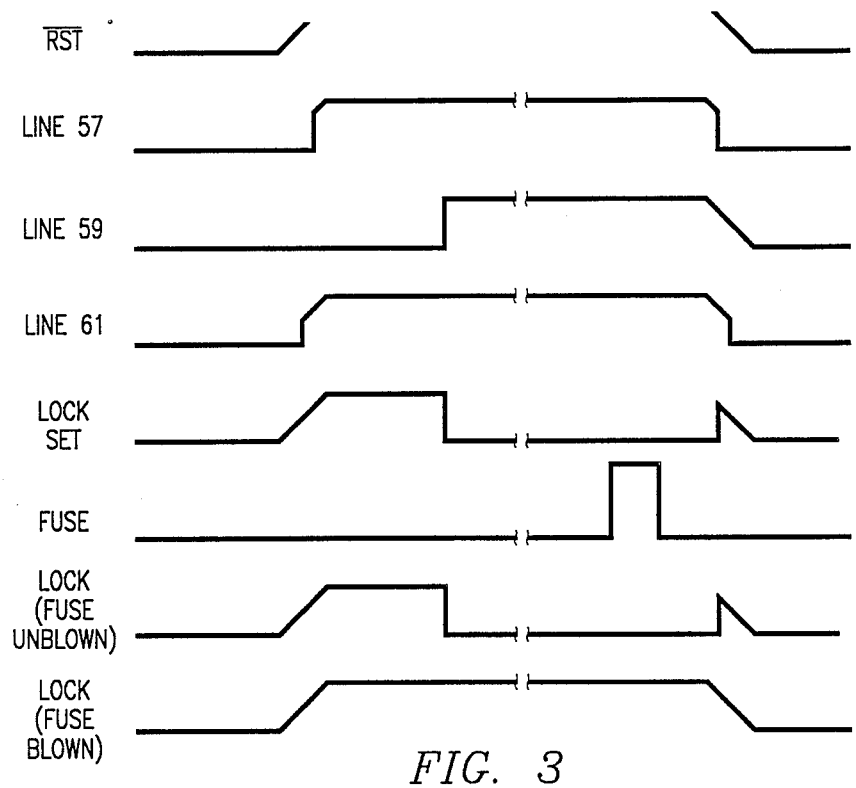
FIG. 3
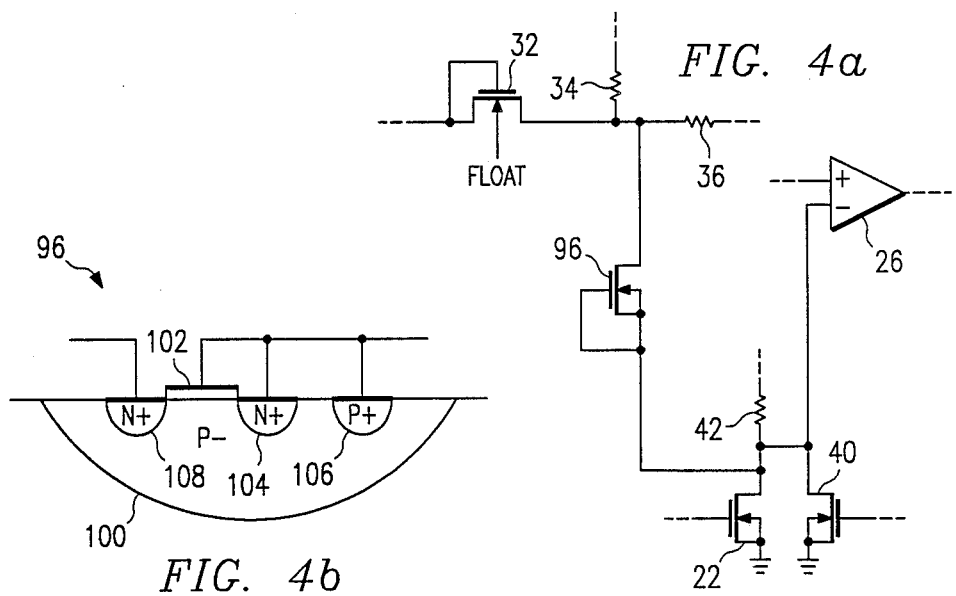
FIG. 4a
FIG. 4b

FUSING AND DETECTION CIRCUIT

REFERENCE TO OTHER APPLICATION

Reference is made to another application of common assignee entitled "Electronic Key Locking Circuitry," Ser. No. 163,281, filed 3/2/88 in the name of Lee, Robert D. et al. That application describes an electronic key containing a fusing and detection circuit which may be built according to the present invention.

TECHNICAL FIELD

This invention relates to integrated circuits which have fuse elements, and more particularly, to fusing and detection circuits within such integrated circuits.

BACKGROUND OF THE INVENTION

In a patent application entitled "Electronic Key Locking Circuitry," Ser. No. 163,281, filed 3/2/88 in the name of Lee, Robert D. et al., there is described an electronic key which provides access to a random access memory upon receipt of a valid password. Included within one embodiment of this electronic key is a timing circuit which provides access to the RAM for a limited time only. This timing circuit is calibrated by the manufacture prior to shipment, and the calibration must be protected so that it cannot be altered by someone other than the manufacturer except in a manner specified by the manufacturer.

Since the integrated circuit is packaged with a backup battery and since the calibration is dependent on the characteristics of the battery, then it is convenient to assemble the integrated circuit and battery as one module and then to perform the calibration after the module has been assembled. However if the calibration is to remain secure inside the integrated circuit, then a method must be used to lock out further calibration adjustments. In the application referenced above a fusing element is used which, when blown, prohibits further access to the calibration circuitry.

The circuit used in conjunction with the fuse element must thus be able to accommodate the currents and voltages required to "blow" the fuse, and further to detect whether the fuse has been blown. Furthermore, the fuse circuitry should be configured in such a manner that the security of the calibration cannot be breached by applying a specific voltage pattern to the pins of the integrated circuit in order to override the effect of the blown fuse.

Therefore, it can be appreciated that a diode and detection circuit which permits a fuse element to be blown, which detects the condition of the fuse element, and which is resistant to circumvention by an end user is highly desirable.

SUMMARY OF THE INVENTION

It is, therefore, an object of this invention to provide a fusing and detection circuit which enables a fusing element to be blown, which detects whether the fuse has been blown, and which is resistant to circumvention by an end user.

Shown in an illustrated embodiment of the invention is a circuit for presenting at an output terminal a voltage indicative of the impedance of a circuit element coupled between a first node and a second node. In the circuit a reference voltage is coupled to the first node and a third node voltage is formed by subtracting a predetermined voltage from the first node. The circuit also includes a current sink coupled to the second node and a comparator for comparing the voltages at the second and the third nodes and for providing a first voltage level at the output terminal if the second node voltage is greater than the third node voltage and provides a second voltage level at the output terminal if the second node voltage is less than the third node voltage.

In a further aspect of the invention, the circuit element is a fusible device and the first node is coupled to a fuse input terminal.

In another aspect of the invention, the output of the circuit is pulled to the first voltage level upon receipt of a lock set signal at a lock set input terminal.

Also shown in an illustrated embodiment of the invention is a method for detecting the condition of a fuse element which includes the steps of first applying a first reference voltage to one terminal of the fuse element connected to a first node and subtracting a predetermined voltage from the voltage at the first node to form a voltage at a second node. A relatively small amount of current is pulled from the second terminal of the fusing element and the voltage at the second terminal of the fuse element is compared with the voltage at the second node, and the result of this comparison is indicative of the condition of the fuse element.

BRIEF DESCRIPTION OF THE DRAWINGS

The aforementioned and other features, characteristics, advantages, and the invention in general, will be better understood from the following, more detailed description taken in conjunction with the accompanying drawings in which:

FIG. 3 is a timing diagram showing various voltage waveforms applicable to the circuits shown in FIG. 1 and FIG. 2.

FIGS. 4A and 4B provide a circuit diagram and a sectional view of an alternative embodiment of the fusing element shown in the circuit diagram of FIG. 1.

Figure 1:
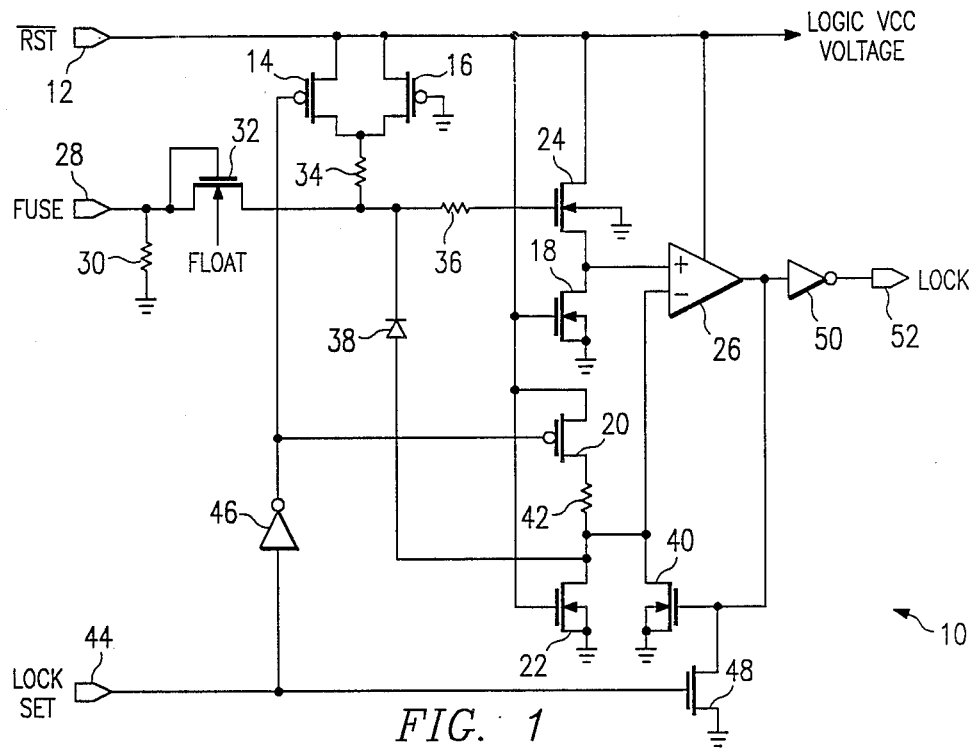
FIG. 1 is a circuit diagram of a fusing and detection circuit according to the present invention.

It will be appreciated that for purposes of clarity and where deemed appropriate, reference numerals have been repeated in the figures to indicate corresponding features. Also, some of the rise times and fall times of the voltages shown in FIG. 3 have been exaggerated to more clearly show the relative timing relationships of the voltages.

DESCRIPTION OF THE PREFERRED EMBODIMENT

The fusing and detection circuit of the present invention provides a fuse element, supporting circuitry to blow the fuse, and also includes circuitry for detecting whether the fuse has been blown. In addition, the fusing and detection circuitry of the present invention is configured in such a manner that it is not readily susceptible to a combination of steady-state voltages or voltage transients applied to the pins of the integrated circuit which would cause the detection circuit to indicate at its output terminal that the fuse had not been blown when, in fact, the fuse had been blown.

To illustrate an advantage of the present invention, in another type of fusing and detection circuit, the fusing element is a diode that is a normal p-n junction in its unblown state and is essentially a short in its blown state, and this fuse diode is connected to a pullup resistor and to the input of an inverter circuit such that the diode, before being blown, is reverse biased and the input voltage to the inverter circuit is therefore at a logic 1 level. The fuse is blown by applying a suitable voltage and current from an external pin of the integrated circuit connected to the node between the diode and the pullup resistor. After the fuse is blown, the input to the inverter would be a logic 0 level. However, the effect of the fuse can be overridden by applying a positive voltage to the fuse input terminal to force the input of the inverter to a logic 1 level. Thus, this simple circuit is susceptible to a positive voltage being applied to the fusing pin which causes the inverter output to indicate that the fuse had not been blown, when, in fact, it had been blown.

Turning now to the drawings, a fusing and detection circuit according to the present invention is shown generally as element 10 in FIG. 1. An input signal, $\overline{RST}$, applied to an $\overline{RST}$ input terminal 12 is used to provide a positive supply voltage for the fusing and detection circuit 10 in the preferred embodiment. The $\overline{RST}$ signal also provides power to the rest of the integrated circuit containing the fusing and detection circuit 10 when the $\overline{RST}$ signal is greater than the voltage from a backup battery connected to the integrated circuit. When the $\overline{RST}$ voltage is less than the battery voltage, then the battery voltage is used to provide power to the portions of the integrated circuit which must function at all times, such as the portions in which permanent data is stored. The substrate of the integrated circuit is biased with either the $\overline{RST}$ voltage or the battery voltage, whichever voltage is more positive.

The $\overline{RST}$ input terminal 12 is connected to the source of a first p-channel transistor 14, to the source of a second p-channel transistor 14, to the gate of an n-channel transistor 18, to the source of a third p-channel transistor 20, to the gate of another n-channel transistor 22, and to the drain of a third n-channel transistor 24. The $\overline{RST}$ signal at the $\overline{RST}$ input terminal 12 also provides a positive supply voltage to a comparator 26.

A second input to the fusing and detection circuit 10 is a fuse input terminal 28. The fuse input terminal 28 is connected to one end of a poly resistor 30, the other end of which is connected to ground. The fuse input terminal 28 is also connected to the drain and gate of an n-channel transistor 32, the source of which is connected to one end of another poly resistor 34, to one end of a third poly resistor 36, and to the cathode of a fuse diode 38. The n-channel transistors 32 is set in a p− well which is a floating p− well, i.e., not connected directly to any other nodes in the integrated circuit. The other end of the poly resistor 34 is connected to the drain of the p-channel transistor 14 and the drain of the p-channel transistor 16. The gate of the p-channel transistor 16 is connected to ground. The other end of the poly resistor 36 is connected to the gate of the n-channel transistor 24. The source of the n-channel transistor 24 is connected to the drain of the n-channel transistor 18 and also connected to a plus input of the comparator 26. The anode of the fuse diode 38 is connected to the drain of the n-channel transistor 22, to a minus input of the comparator 26, to the drain of another n-channel transistor 40, and to one end of a poly resistor 42, the other end of which is connected to the drain of the p-channel transistor 20. The source of the n-channel transistor 22 and the source of the n-channel transistor 40 are connected to ground.

A third input to the fusing and detection circuit 10 is a lock set input terminal 44 which is connected to the input of an inverter 46 and to the gate of an n-channel transistor 48. The output of the inverter 46 is connected to the gate of the p-channel transistor 14 and to the gate of the p-channel transistor 20. The source of the n-channel transistor 48 is connected to ground. The drain of the n-channel transistor 48 is connected to the gate of the n-channel transistor 40, to the output of the comparator 26, and to the input of an inverter 50, the output of which forms the lock signal at a lock output terminal 52.

Figure 2:
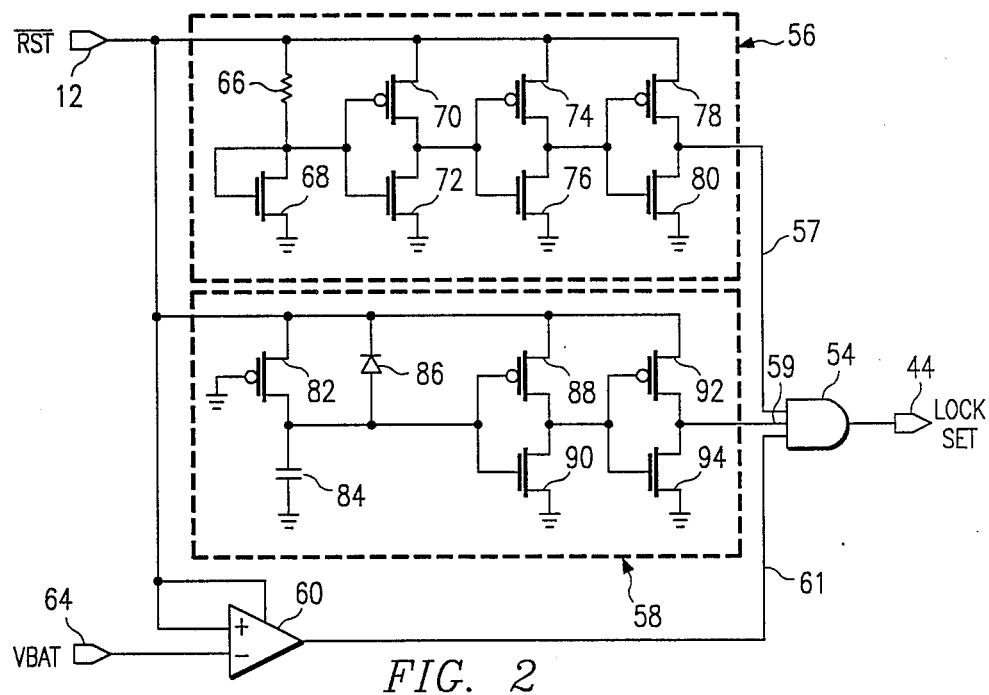
FIG. 2 is a circuit diagram of circuitry used to form a lock set signal which is an input to the fusing and detection circuit shown in FIG. 1.

The lock set signal applied to the lock set input terminal 44 of FIG. 1 is formed at the output of a NAND gate 54 of FIG. 2. As shown in FIG. 2 the $\overline{RST}$ signal from the $\overline{RST}$ input terminal 12 is connected to three circuits. The first circuit is a voltage level detection circuit which is contained within the dashed outline 56 and which has an output on a line 57, the second circuit is a delay circuit which is contained within the outlined area 58 and which has an output on a line 59, and the third circuit is a comparator 60 which detects if the $\overline{RST}$ signal is greater than the battery voltage which is applied to a VBAT input terminal 64 and which has an output on a line 61. Within the voltage level detection circuit 56, the $\overline{RST}$ signal is connected to one end of a resistor 66, the other end of which is connected to the drain and gate of an n-channel transistor 68, the source of which is connected to ground. The drain of the n-channel transistor 68 is connected to the input of a first inverter consisting of an upper p-channel transistor 70 and a lower n-channel transistor 72. The source of the p-channel transistor 70 is connected to the $\overline{RST}$ signal, and the source of the n-channel transistor 72 is connected to ground. The input of the inverter is connected to the gates of the p-channel transistor 70 and the n-channel transistor 72 and the common drain node of the p-channel transistor 70 and the n-channel transistor 72 forms the output which is connected to the input of a second inverter stage having an upper p-channel transistor 74 and a lower n-channel transistor 76. The output of this inverter stage is connected to the input of a third inverter stage having an upper p-channel transistor 78 and a lower n-channel transistor 80. The output of this third stage at the common drain connection of the p-channel transistor 78 and the n-channel transistor 80 is connected to the line 57 which in turn is connected to one input of the NAND gate 54.

The delay circuit 58 connects the $\overline{RST}$ signal to the source of a p-channel transistor 82, the gate of which is connected to ground and the drain of which is connected to one end of a capacitor 84, the other end of which is connected to ground. The drain of the p-channel transistor 82 is connected to the anode of a diode 86, the cathode of which is connected to the $\overline{RST}$ signal. The drain of the p-channel transistor 82 is also connected to the input of an inverter stage consisting of an upper p-channel transistor 88 having its source connected to the $\overline{RST}$ signal, and a lower n-channel transistor 90 having its source connected to ground. The output of this inverter stage is connected to the input of a second inverter stage having an upper p-channel transistor 92 and a lower n-channel transistor 94. The output of this second inverter stage is connected to the line 59 which in turn is connected to a second input of the NAND gate 54.

The $\overline{\text{RST}}$ signal is also connected to a plus input of the comparator 60 and also provides power to the comparator 60. A minus input of the comparator 60 is connected to the VBAT input terminal 64. The output of the comparator 60 is connected to the line 61 which in turn is connected to a third input of the NAND gate 54.

OPERATION

In operation, the fusing and detection circuit 10 of FIG. 1 is, in the preferred embodiment, designed to operate with a fusing diode 38 which is a normal p-n junction diode when fabricated, and when blown becomes a low resistance device. The lock output terminal 52 is a logic 0 level when the system is unlocked (before the fuse diode 38 has been blown, when it operates as a p-n junction), and a logic 1 level when the system is locked (after the fuse diode 38 has been blown or converted to a resistive element). The lock output terminal 52 will also be a logic 1 level when the lock set input terminal 44 is at a logic 1 level regardless of the condition of the fuse diode 38. Thus a logic 1 level at the lock set input terminal 44 operates to preset the fusing and detection circuit 10 to a locked state.

More specifically, when the lock set input terminal 44 is a logic 1 level, the n-channel transistor 48 will overdrive the output of the comparator 26 to a logic 0 level which will cause the output of the inverter 50 to be a logic 1 level to thus provide a logic 1 level at the lock output terminal 52. At the same time, the inverter 46 will enable or make conductive the p-channel transistor 20 which will conduct the $\overline{\text{RST}}$ signal through resistor 42 onto the minus input of the comparator 26. While the n-channel transistor 22 is also enabled at this time by the application of the $\overline{\text{RST}}$ signal on the gate of the n-channel transistor 22, it will be appreciated that the n-channel 22 is a low conductivity transistor and has an equivalent resistance which is much larger than the channel resistance of the p-channel transistor 20 and the resistance of the resistor 42, and therefore the minus input of the comparator 26 is held at a voltage approximately equal to the $\overline{\text{RST}}$ signal voltage. The n-channel transistor 40 is disabled or made nonconductive since its gate is pulled to ground potential by the action of the n-channel transistor 48.

The inverter 46 also enables the p-channel transistor 14; and it and the p-channel transistor 16 provide a path for the $\overline{\text{RST}}$ signal through the resistor 34, through the resistor 36 and onto the gate of the n-channel transistor 24. The source voltage of the n-channel transistor 24, which is applied to the plus input of the comparator 26, is the voltage at the cathode of the fuse diode 38, which is essentially the $\overline{\text{RST}}$ signal voltage, minus the threshold voltage of the n-channel transistor 24. The n-channel transistor 18 has significantly less conductivity than the n-channel transistor 24. The n-channel transistor 18 and the n-channel transistor 22 operate as current sources to sink current from the plus and minus inputs respectively of the comparator 26. The n-channel transistor 32 is connected as a diode, and under normal operating conditions, in which the fuse input pin 28 is not connected to any external circuitry and the poly resistor 30 operates to pull the fuse input terminal 28 to ground potential, the diode formed by the n-channel transistor 32 will be reverse biased.

The fuse diode 38 prior to being blown, operates as a p-n junction device, and since the cathode is essentially at the $\overline{\text{RST}}$ signal voltage and the anode is slightly less than the $\overline{\text{RST}}$ signal voltage due to the action of the n-channel transistor 22, then virtually no current will flow through the fuse diode 38. Also, if the fuse diode 38 is blown such that it is a small impedance rather than a diode, then the amount of current flowing through the fuse diode 38 will cause the voltage at the minus input of the comparator 26 to be slightly lower than the voltage at the cathode of the fuse diode 38.

Under these conditions the minus input of the comparator 26 will be at a greater voltage than the positive input of the comparator 26 which will cause the comparator 26 to put a logic 0 level at its output terminal, which is the same logic level produced by the action of the n-channel transistor 48.

After the lock set node 44 switches from a logic 1 level to a logic 0 level, the lock output terminal 52 will remain at a logic 1 level if the fuse diode 38 has been blown and will switch to a logic 0 level if the fuse diode 38 has not been blown. If the fuse diode 38 has not been blown such that the fuse diode 38 operates as a p-n junction, then when the lock set node 44 switches to a logic 0 level, the output of the comparator 26 will not be held to ground by the n-channel transistor 48 since it will have become disabled, and the p-channel transistors 14 and 20 will also become disabled. The n-channel transistors 24, 18, and 22 will remain enabled and the plus input of the comparator 26 will remain at the $\overline{\text{RST}}$ signal voltage minus the threshold voltage of the n-channel transistor 24. However, since the fuse diode 38 is reverse biased, and the p-channel transistor 20 is disabled, the n-channel transistor 22 will discharge the voltage on the minus input of the comparator 26 to pull the minus input of the comparator 26 toward ground potential. When the minus input voltage of the comparator 26 falls below the plus input voltage of the comparator 26, the output of the comparator 26 will switch to a logic 1 level which will enable the n-channel transistor 40 which will rapidly discharge the voltage on the minus input terminal of the comparator 26. This logic 1 level at the output of the comparator 26 will be inverted by the inverter 50 to place a logic 0 level on the lock output terminal 52.

However, when the fuse diode 38 has been blown or changed to a small resistance, then when the lock set voltage on node 44 switches to a logic 0 level, the $\overline{\text{RST}}$ signal voltage that is coupled through the p-channel transistor 16 and the poly resistor 34 will be coupled through the fuse diode 38 onto the minus input of the comparator 26. In the preferred embodiment, the current through the n-channel transistor 22 multiplied by the resistance of the fuse diode 38 after it is blown is much less than the threshold voltage of the n-channel transistor 24, and the minus input voltage of the comparator 26 will be greater than the plus input voltage of the comparator 26. The output of the comparator 26 will therefore be a logic 0 level which will produce a logic 1 level on the lock output terminal 52.

The lock set signal on the lock set input terminal 44 in the preferred embodiment is brought high between each cycle of operation of the integrated circuit so that the protected data is relocked before each cycle. Therefore, if for some reason the lock signal on output terminal 52 should indicate a false unlock condition, the correct lock status will be restored prior to the next cycle. Thus, the lock set signal on node 44 is used to further assure that the lock signal on output terminal 52 will remain in a locked condition when the integrated circuit is being used by the end user. However, it will be appreciated that the lock set signal on node 44 does not have to be brought high between each cycle, but could be brought high at other times using signals inside the integrated circuit which are convenient for this relock function, or could be held low at all times if this added assurance is deemed unnecessary.

Turning now to FIGS. 2 and 3, the lock set signal on node 44 is at a logic 1 level any time any of the three inputs to the NAND gate 54 on the lines 57, 59, and 61 is at a logic 0 level. Thus, the lock set signal on node 44 will be a logic 1 level any time the output of the voltage level detector circuit 56 on line 57 is a logic 0 level, the output of the transient detection circuit 58 on line 59 is a logic 0 level, or the output of the comparator 60 on line 61 is at a logic 0 level. Each of these three circuits is responsive to the $\overline{RST}$ signal at input terminal 12.

The level detection circuit 56 of FIG. 2 provides an undefined output when the $\overline{RST}$ signal is less than the threshold voltage of the n-channel transistor 68, provides a logic 0 level to the input of the NAND gate 54 when the $\overline{RST}$ signal voltage is between one threshold and two threshold voltages of the MOS transistors and provides a logic 1 level at its output when the $\overline{RST}$ signal voltage is greater than two threshold voltages. More particularly, when the $\overline{RST}$ signal voltage is less than one threshold voltage, the output at the common drain connection of the p-channel transistor 78 and the n-channel transistor 80 on the line 57 is undefined. When the $\overline{RST}$ signal voltage goes above one threshold voltage but is less than two threshold voltages, than the drain of the n-channel transistor 68 will be at one threshold voltage. Advantageously, the p-channel transistor 70 and the n-channel transistor 72 have their channel dimensions ratioed such that the inverter circuit made by these two transistors triggers at one-half of the $\overline{RST}$ signal voltage. Since under these conditions the drain voltage of the n-channel transistor 68 is greater than half of the $\overline{RST}$ signal voltage, then the output of the first inverter stage consisting of the p-channel transistor 70 and the n-channel transistor 72 will be a logic 0 level and the output of the threshold detector circuit 56 will also be logic 0 level which will force the lock set signal to a logic 1 level. When the $\overline{RST}$ signal voltage rises above two threshold voltages, then the drain voltage of the n-channel transistor 68 will remain at one threshold voltage but the output of the inverter circuit comprised of the p-channel transistor 70 and the n-channel transistor 72 will switch to a logic 1 level, and the threshold voltage detection circuit 56 will provide a logic 1 level on the line 57 to the NAND gate 54.

In normal operation the delay circuit 58 provides a logic 0 at its output for a predetermined time delay after the $\overline{RST}$ pulse rises to a logic 1 level. The delay circuit 58 therefore operates as a one shot to provide a logic 0 output on the line 59 for a predetermined delay time after the rising edge of the $\overline{RST}$ signal if the $\overline{RST}$ signal rises faster than the RC time constant provided by the resistance of the channel of the p-channel transistor 82 and the capacitance of the capacitor 84. More particularly, when the $\overline{RST}$ signal on the input terminal 12 rises, the capacitor 84 begins to charge through the p-channel transistor 82. When the voltage on the capacitor 84 is less than the trip voltage of the inverter consisting of the p-channel transistor 88 and the n-channel transistor 90, then the output of the delay circuit 58 will be a logic 0 level. When the voltage across the capacitor 84 exceeds the trip voltage of the first inverter circuit, then the output of the transient detection circuit 58 will be a logic 1 level. The diode 86 is used to quickly discharge the capacitor 84 when the $\overline{RST}$ signal drops from a higher voltage to a lower voltage. Thus, in normal operation when the $\overline{RST}$ signal on line 12 is brought high to initiate a cycle of operation of the integrated circuit, then the lock set signal is also brought to a logic 1 level for a time determined by the time constant of the p-channel transistor 82 and the capacitor 84 to relock the fuse and detection circuit 10. The time delay in the preferred embodiment is long enough to insure that the fusing and detection circuit 10 will be in a locked state. It will be appreciated that the delay circuit 58 will also provide a logic 0 level output on the line 59 if the $\overline{RST}$ signal is pulled from a logic 1 level to some higher voltage, provided that the slope of the rising edge of the $\overline{RST}$ signal is faster than the time constant of the p-channel transistor 82 and the capacitor 84.

The comparator 60 senses when the $\overline{RST}$ signal voltage is less than or greater than the battery voltage at the VBAT input terminal 64. When the $\overline{RST}$ signal voltage is less than the battery voltage, then the output of the comparator 60 on the line 61 will be a logic 0 level which will force the lock set signal to a logic 1 level. When the $\overline{RST}$ signal voltage is greater than the battery voltage, then the output of the comparator 60 on the line 61 will be a logic 1 level.

FUSING ELEMENT

The fuse diode 38 in the preferred embodiment is an $n^+$ diffusion formed in a $p^-$ well. The $n^+$ diffusion is relatively shallow, on the order of 0.3 to 0.5 microns, and the fuse diode 38 is blown by reverse biasing the diode with 20 to 25 volts which places the diode in reverse breakdown condition with about 20 to 50 milliamps of current flowing through the diode. Under these conditions the aluminum metallization of the $n^+$ contact alloys and spikes through the $n^+$ diffusion into the $p^-$ well to form a low impedance resistive element.

In order for a voltage of this magnitude and a current this large to pass through the fuse diode 38, additional circuit elements are required to protect the integrated circuit from latch-up and to protect the stored data and calibration information from being changed by currents injected into the substrate. The poly resistors 34 and 42 are resistors formed in polysilicon and are provided to protect the substrate from large amounts of current injection during the fusing process. Since in the p-channel transistors 14 and 16 the $p^+$ drain regions form a $p-n$ junction with the $n^-$ substrate, the fuse voltage on the fuse input terminal 28 would be passed directly to the substrate if the poly resistors 30, 34, and 42 were not present to restrict the amount of current injected into the substrate. The poly resistor 42 is in place to protect the substrate after the fuse is blown. Also, the power supply providing the fuse voltage is current limited to approximately 50 milliamps or else the current through the fusing and detection circuit 10 would rise very high since the impedance of the fuse diode 38 drops dramatically when the aluminum spikes through the $n^+$ region of the fuse diode 38. The n-channel transistor 40 has a large width-to-length ratio to carry the 50 milliamps of current used in the fusing operation. As stated above, the n-channel transistor 40 is enabled when the diode fuse 38 is not blown and the lock set node 44 is at a logic 0 level.

Because of the high voltage and the fact that some current is injected into the substrate during the programming operation, the fusing and detection circuit 10 is located in a separate region of the integrated circuit away from data stored in the integrated circuit, and is surrounded by appropriate guard rings to further lessen the effect of current injected into the substrate on the stored data in the other portions of the integrated circuit.

An alternative embodiment of the fusing element is shown in FIG. 4A in which the fuse diode 38 of FIG. 1 has been replaced by a fuse transistor 96. The drain of the fuse transistor 96 is connected to the common node of the n-channel transistor 32, the poly resistor 34 and the poly resistor 36. The source of the fuse transistor 96 is connected to its gate and also to its p− well and to the common connection of the drain of the n-channel transistor 22, the poly resistor 42, the drain of the n-channel transistor 40 and the negative input of the comparator 26.

The fuse transistor 96 operates in the same manner as the fuse diode 38. That is, the fuse transistor 96 operates as a reverse bias diode prior to being fused and has characteristics of a low impedance after the fuse transistor 96 has been blown.

FIG. 4B shows a sectional view of the fuse transistor 96 according to the present invention. The fuse transistor 96 is set in a p− well 100 and the gate 102 is connected to the source n+ region 104 and to a p+ contact 106 to the p− well. The p−n junction is formed between the p− well 100 and the drain n+ region 108. The n+ diffusion regions 104 and 108 are relatively shallow, on the order of 0.3 to 0.5 microns. The fuse transistor 96 is blown in the same manner as the fuse diode 38, i.e., by the application of 15 to 20 volts between the drain and source terminals of the fuse transistor 96. Advantageously, it has been found that the fuse transistor 96 is more easily blown (does not require as much current) and blows more consistently than the fuse diode 38. Thus, the fuse transistor 96 is used in the preferred embodiment of the invention.

How the fusing operation actually occurs in the fuse transistor 96 is not completely understood. The fusing action could be caused by the alloying and spiking through of the metalization over the drain n+ region in the p− well, but may also be caused by a short circuit formed from the drain n+ region 108 into the gate 102 or by some current path between the drain n+ region 108 and the source n+ region 104.

PROTECTION FEATURES

The fusing and detection circuit 10 of the present invention provides protection features to thwart several different methods of trying to unlock the circuit (by causing a logic 0 level at the lock output terminal 52 after the diode fuse 38 has been blown). One important protection feature used in the fusing and detection circuit 10 is that the polarity of the voltage used to blow the fuse diode 38 will not unlock the fusing and detection circuit 10 after the fuse diode 38 is blown, which was the problem with the example described in the second paragraph of this Description of the Preferred Embodiment section. Rather, instead of unlocking the fusing and detection circuit 10, the application of the voltage used to blow the fuse will cause a greater imbalance at the input of the comparator 26 and thereby lock up the fusing and detection circuit 10 "harder."

This feature can be understood by referring again to FIG. 1 and to the path of the voltage applied to the fuse input terminal 28. A positive voltage applied to the fuse input terminal 28 will cause the voltage at the cathode of the fuse diode 38 to rise which will also cause the gate voltage of the n-channel transistor 24 to rise and the voltage at the minus input terminal of the comparator 26 to rise. These two voltages will increase as the voltage at the cathode of the fuse diode 38 rises above the $\overline{RST}$ signal voltage and will rise in equal amounts until the voltage at the cathode of the fuse diode 38 is greater than a threshold voltage above the $\overline{RST}$ signal voltage. At this point the positive input of the comparator 26 will remain at the $\overline{RST}$ signal voltage while the negative input of the comparator 26 will continue to rise with the voltage applied to the fuse input terminal 28. Since the lock output terminal 52 will indicate a lock condition when the minus input of the comparator 26 is greater than the positive input of the comparator 26, the higher voltage at the fuse input terminal 28 will thus cause a greater imbalance between the plus and minus inputs of the comparator 26.

As stated previously, attempts at unlocking the fusing and detection circuit 10 are encumbered by the required reset operation (pulling the $\overline{RST}$ signal to a logic 0 level) between each cycle of the integrated circuit. Another protection measure is the n-channel transistor 32 which forms a diode in series with the fuse input terminal 28. Thus, it is not possible to pull the voltage at the cathode of the fuse diode 38 to a lower steady-state voltage by applying a low voltage at the fuse input terminal 28. Finally, the application of a higher voltage on the $\overline{RST}$ input terminal 12 will not unlock the fusing and detection circuit 10 since the relative voltage differential between the plus and minus inputs of the comparator 26 will remain the same.

The fusing and detection circuit 10 also provides protection from transient voltages applied to the $\overline{RST}$ input terminal 12 or the fuse input terminal 28. For example, if the $\overline{RST}$ signal is brought high slowly in order to make ineffective the delay circuit 58, then the threshold detection circuit 56 will operate to lock the fusing and detection circuit 10 until the $\overline{RST}$ signal is greater than two threshold voltages. The comparator 60 will also lock the fusing and detection circuit 10 until the $\overline{RST}$ signal voltage is greater than the battery voltage. If an attempt is made to rapidly pull the $\overline{RST}$ signal voltage from a logic 1 level to a greater voltage, then the delay circuit 58 will again provide a logic 0 output for a predetermined time period to thereby lock the fusing and detection circuit 10.

If an attempt is made to pull the fuse input terminal 28 to a minus voltage and to capacitively couple this negative pulse through the n-channel transistor 32, then the fusing and detection circuit 10 will retain the correct lock output since, in the preferred embodiment, the conductivity of the n-channel transistor 18 is slightly greater than the conductivity of the n-channel transistor 22 and thus the positive input of the comparator 26 will be pulled to a lower voltage faster than the minus input to the comparator 26.

It will be understood by those skilled in the art that the p-channel transistor 14 and the poly resistor 36 were added during the design process for reasons which later became obviated, but were left in the integrated circuit. While it is believed that the fusing and detection circuit 10 will operate properly without the p-channel transistor 14 and the poly resistor 36, the full effect of the removal of these devices is not known.

The fusing and detection circuit of the present invention is therefore able to provide circuitry for accommodating the voltages and currents required to blow the fuse diode 38 and for detecting the condition of the fuse diode 38, ad for thwarting efforts to unlock the fusing and detection circuitry 10 by the application of steady state voltages and transient voltages to the external pins of the integrated circuit.

Although the invention has been described in part by making detailed reference to a specific embodiment, such detail is intended to be and will be understood to be instructional rather than restrictive. It will be appreciated by those skilled in the art that many variations may be made in the structure and mode of operation without departing from the spirit and scope of the invention, as disclosed in the teachings contained herein. For example, the fusing diode 38 could be replaced by a fusing element which is a low impedance prior to being blown and which becomes a high impedance after being blown. Under these conditions, the lock set circuitry including the n-channel transistor 48 and the inverter 46 would need to be suitably modified to force the proper lock status at the lock output terminal 52 since the polarity at the output of the comparator 26 would be a logic 1 level when the fusing element has been blown, which is opposite to the preferred embodiment described above. Also, the $\overline{RST}$ signal voltage appearing at the $\overline{RST}$ input terminal 12 of FIG. 1 could be replaced by a constant supply voltage to provide power to the fusing and detection circuit of FIG. 1.

What is claimed is:

1. A fusing and detection circuit, for providing at an output terminal a logic signal indicative of whether a diode fuse has been blown, comprising:
   (a) a fuse input terminal;
   (b) a first node connected to the cathode of the diode fuse, said first node being coupled to said fuse input terminal;
   (c) a second node connected to the anode of said diode fuse;
   (d) means for coupling said first node to a power supply voltage node;
   (e) a first n-channel transistor, the gate of which is coupled to said first node and the drain of which is coupled to said power supply node;
   (f) a second n-channel transistor, the gate of which is coupled to said power supply voltage node, the drain of which is coupled to the source of said first n-channel transistor, and the source of which is coupled to a ground reference node;
   (g) a third n-channel transistor, the gate of which is coupled to said power supply node, the drain of which is coupled to said second node and the source of which is coupled to said ground reference node;
   (h) comparison means for comparing the voltage at the source of said first transistor to the voltage at said second node, the output of said comparison means being coupled to said output terminal.

2. A fusing and detection circuit, within an integrated circuit, comprising:
   a fuse element;
   a fuse input terminal connected so that said fuse element can be blown by applying a large abnormal voltage to said first terminal;
   a comparator,
      having first and second inputs operatively connected to said fuse element in such relation that said first input of said comparator receives a voltage which is dependent on the state of said fuse element
      and said second input of said comparator receives a voltage which is not substantially dependent on the state of said fuse element,
   wherein said comparator compares said first and second inputs and provides a logic output which, in a first state, indicates that said fuse has not been blown, and, in a second state, indicates that said fuse has been blown;
   wherein said fuse input terminal is operatively connected to said inputs of said comparator in such relation that any large abnormal voltage whish is applied to said first terminal will tend to drive the output of said comparator into said second state;
   and further comprising a lock set input, which is operatively connected to said comparator in such relation that a signal on said lock set input can drive the output of said comparator into said second state, regardless of the state of said fuse element, without changing the state of said fuse element.

3. The circuit of claim 2, wherein an externally received power supply voltage is operatively connected to said inputs of said comparator in such relation that any large abnormal voltage which is applied to said power supply will tend to drive the output of said comparator into said second state.

4. The circuit of claim 2, wherein said second input of said comparator is connected to receive an externally received power supply voltage reduced by a predetermined amount, and said first input of said comparator is connected to receive an externally received power supply voltage reduced by an ohmic voltage drop which is proportional to the current passed by said fuse element.

5. The circuit of claim 2, wherein said fuse element has a high impedance before being blown, and has a low impedance after being blown.

6. The circuit of claim 2, wherein said fuse element, before being blown, consists essentially of a junction diode.

7. The circuit of claim 2, wherein said fuse element, before being blown, consists essentially of a field-effect transistor.

8. The circuit of claim 2, further comprising an additional field-effect transistor, which is connected in series with said fuse input terminal, and which has a gate thereof tied to a drain thereof.

9. A fusing and detection circuit, within an integrated circuit, comprising:
   a fuse element;
   a fuse input terminal, connected so that said fuse element can be blown by applying a large abnormal voltage to said fuse input terminal;
   a comparator,
      having first and second inputs operatively connected to said fuse element in such relation that said first input of said comparator receives a voltage which is dependent on the state of said fuse element
      and said second input of said comparator receives a voltage which is not substantially dependent on the state of said fuse element,
   wherein said comparator compares said first and second inputs and provides a logic output which, in a first state, indicates that said fuse element has not been blown, and, in a second state, indicates that said fuse element has been blown;
   wherein said fuse input terminal is operatively connected to said inputs of said comparator in such relation that any large abnormal voltage which is applied to said fuse input terminal will tend to drive the output of said comparator into said second state;

a lock set input, which is operatively connected to said comparator in such relation that a signal on said lock set input can drive the output of said comparator into said second state, regardless of the state of said fuse element, without changing the state of said fuse element, and which is connected to logic such that said comparator output is driven into said second state whenever it is not true that the externally received power supply voltage has not been continuously within a predetermined range of voltages, at approximately the nominal voltage of said externally received power supply, for at least a predetermined time period.

10. The circuit of claim 9, wherein said second input of said comparator is connected to receive an externally received power supply voltage reduced by a predetermined amount, and said first input of said comparator is connected to receive an externally received power supply voltage reduced by an ohmic voltage drop which is proportional to the current passed by said fuse element.

11. The circuit of claim 10, further comprising a high-impedance load element connected to draw current through said fuse element.

12. The circuit of claim 9, wherein said fuse element has a high impedance before being blown, and has a low impedance after being blown.

13. The circuit of claim 9, wherein said lock set input is also connected to said logic such that said comparator output is driven into said second state whenever a voltage received from a battery is greater than the externally received power supply voltage.

14. The circuit of claim 9, wherein said lock set input is also connected to said logic such that said comparator output is driven into said second state whenever an externally received power supply voltage is within a predetermined range of voltages, which includes only voltages which are significantly less than the nominal voltage of said externally received power supply voltage and which are significantly greater than zero.

15. An integrated circuit comprising:
a timing circuit which can be calibrated; and
a fusing and detection circuit, comprising:
a fuse element;
a fuse input terminal, connected so that said fuse element can be blown by applying a large abnormal voltage to said fuse input terminal;
a comparator,
having first and second inputs operatively connected to said fuse element in such relation that
said first input of said comparator receives a voltage which is dependent on the state of said fuse element
and said second input of said comparator receives a voltage which is not substantially dependent on the state of said fuse element,
wherein said comparator compares said first and second inputs and provides a logic output which, in a first state, indicates that said fuse element has not been blown, and, in a second state, indicates that said fuse element has been blown;
wherein said fuse input terminal is operatively connected to said inputs of said comparator in such relation that any large abnormal voltage which is applied to said fuse input terminal will tend to drive the output of said comparator into said second state;
wherein said output of said comparator is connected to said timing circuit so that said second output state of said comparator prevents calibration of said timing circuit.

16. The circuit of claim 15, wherein said second input of said comparator is connected to receive an externally received power supply voltage reduced by a predetermined amount, and said first input of said comparator is connected to receive an externally received power supply voltage reduced by an ohmic voltage drop which is proportional to the current passed by said fuse element.

17. The circuit of claim 16, further comprising a high-impedance load element connected to draw current through said fuse element.

18. The circuit of claim 15, wherein an externally received power supply voltage is operatively connected to said inputs of said comparator in such relation that any large abnormal voltage which is applied to said power supply will tend to drive the output of said comparator into said second state.

19. The circuit of claim 15, further comprising a lock set input, which is operatively connected to said comparator in such relation that a signal on said lock set input can drive the output of said comparator into said second state, regardless of the state of said fuse element, without changing the state of said fuse element.

20. The circuit of claim 15, wherein said fuse element has a high impedance before being blown, and has a low impedance after being blown.

* * * * *